(12) United States Patent
Tada et al.

(10) Patent No.: US 11,664,342 B2
(45) Date of Patent: May 30, 2023

(54) SEMICONDUCTOR DEVICE WITH A LASER-CONNECTED TERMINAL

(71) Applicant: FUJI ELECTRIC CO., LTD., Kawasaki (JP)

(72) Inventors: Shinji Tada, Matsumoto (JP); Ryoichi Kato, Matsumoto (JP); Yoshinari Ikeda, Matsumoto (JP); Yuma Murata, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 175 days.

(21) Appl. No.: 17/345,554

(22) Filed: Jun. 11, 2021

(65) Prior Publication Data

US 2021/0407955 A1  Dec. 30, 2021

(30) Foreign Application Priority Data

Jun. 25, 2020  (JP) .............................. JP2020-109429

(51) Int. Cl.
*H01L 23/00* (2006.01)
*H01L 23/495* (2006.01)
(Continued)

(52) U.S. Cl.
CPC .............. *H01L 24/40* (2013.01); *H01L 24/84* (2013.01); *H01G 2/04* (2013.01); *H01G 2/065* (2013.01);
(Continued)

(58) Field of Classification Search
CPC ....... H01L 24/34; H01L 24/35; H01L 24/744; H01L 24/77; H01L 24/84; H01L 2224/95; H01L 2224/9511; H01L 2224/95122; H01L 2224/77611; H01L 2224/7765; H01L 2224/767
See application file for complete search history.

(56) References Cited

U.S. PATENT DOCUMENTS

| | | | |
|---|---|---|---|
| 5,786,230 A * | 7/1998 | Anderson | ............... H01L 24/84 |
| | | | 257/E23.101 |
| 9,468,993 B2 * | 10/2016 | Miyasaka | ............. H01L 23/047 |
| 9,741,678 B2 * | 8/2017 | Matsushita | ............. H01L 24/84 |

FOREIGN PATENT DOCUMENTS

| | | |
|---|---|---|
| JP | H06-262377 A | 9/1994 |
| JP | 2007-234694 A | 9/2007 |

(Continued)

*Primary Examiner* — David A Zarneke
(74) *Attorney, Agent, or Firm* — Rabin & Berdo, P.C.

(57) ABSTRACT

A semiconductor device, including a capacitor, a semiconductor module having a first power terminal formed on a front surface of a first insulating member, and a connecting member electrically connecting and mechanically coupling the semiconductor module and the capacitor to each other, the connecting member having a front surface and a rear surface opposite to each other, the rear surface being on a front surface of the first power terminal. The connecting member is bonded to the semiconductor module via a first welded portion, which penetrates the front and rear surfaces of the connecting member, and penetrates the front surface of the first power terminal, in a thickness direction of the semiconductor device, a distance in the thickness direction between a bottommost portion of first welded portion and the front surface of the first insulating member being 0.3 mm or more.

12 Claims, 12 Drawing Sheets

(51) Int. Cl.
*H01L 23/482* (2006.01)
*H01G 2/04* (2006.01)
*H01G 2/10* (2006.01)
*H01G 2/06* (2006.01)

(52) U.S. Cl.
CPC .......... *H01G 2/106* (2013.01); *H01L 23/4822* (2013.01); *H01L 23/49589* (2013.01); *H01L 2224/40155* (2013.01); *H01L 2224/84214* (2013.01); *H01L 2924/1205* (2013.01)

(56) References Cited

FOREIGN PATENT DOCUMENTS

| | | |
|---|---|---|
| JP | 2010-141163 A | 6/2010 |
| JP | 2011-203055 A | 10/2011 |

\* cited by examiner

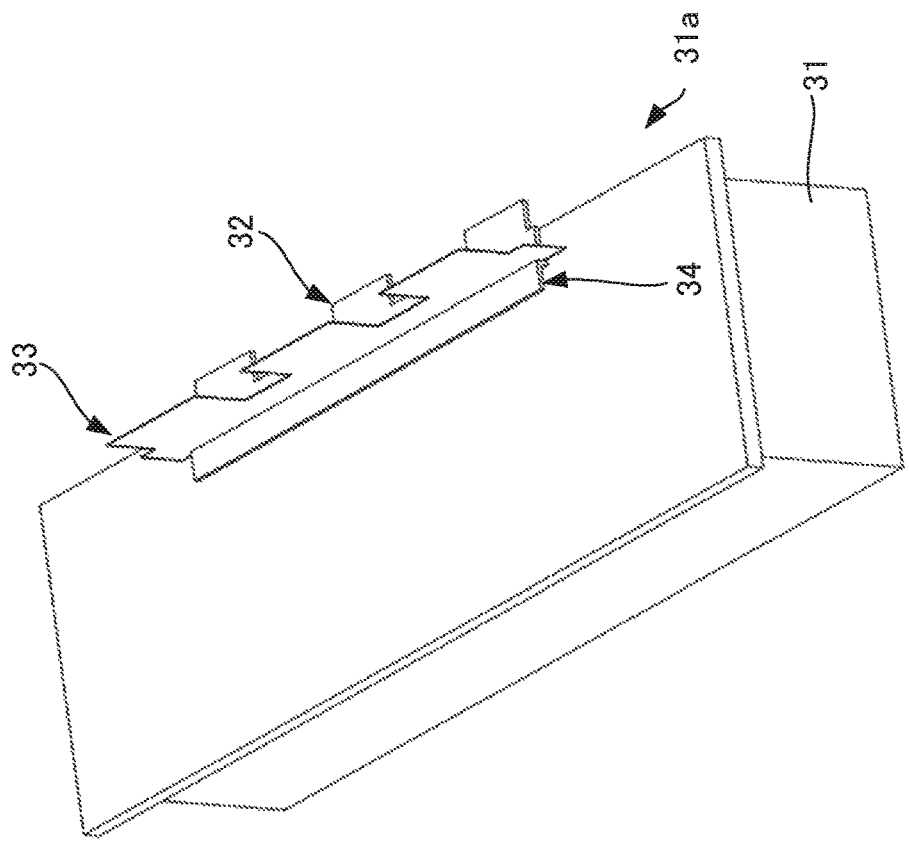
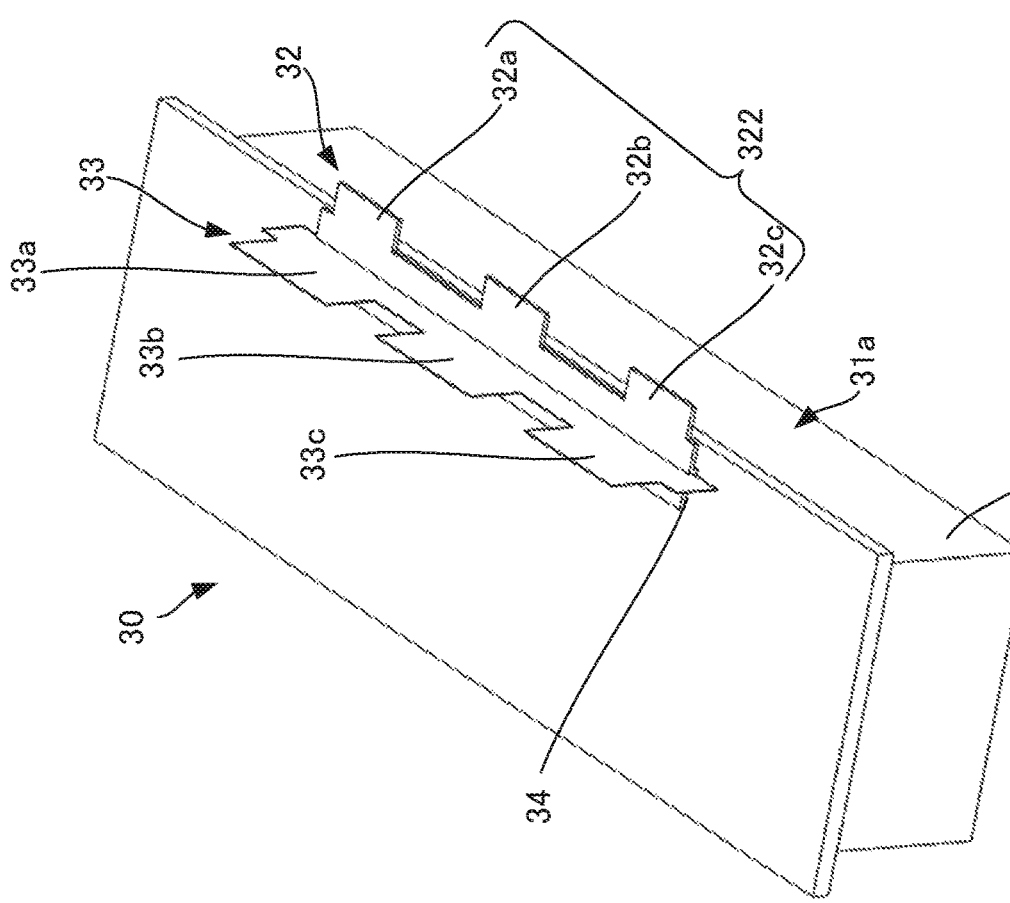

| LASER OUTPUT | 1.00 | 1.02 | 1.04 | 1.06 | ... |
|---|---|---|---|---|---|
| INSULATION PROPERTY | GOOD | GOOD | GOOD | POOR | POOR |
| DISTANCE D[mm] | 0.48 | 0.38 | 0.31 | 0 | ... |

FIG. 11

| LASER OUTPUT | 0.96 | 0.98 | 1.00 | 1.02 | 1.04 | 1.06 | 1.08 | 1.10 |
|---|---|---|---|---|---|---|---|---|
| WELDING PROPERTY | POOR | GOOD | GOOD | GOOD | GOOD | POOR | POOR | POOR |
| STRENGTH (AVERAGE)[N] | 10 | 20 | 38 | 46 | 56 | 67 | 62 | 70 |
| STRENGTH PROPERTY | POOR | GOOD | GOOD | GOOD | GOOD | GOOD | GOOD | GOOD |
| WELDED AREA S[mm²] | 0.16 | 0.22 | 0.41 | 0.44 | 0.48 | 0.61 | 0.50 | 0.62 |

FIG. 12

SEMICONDUCTOR DEVICE WITH A LASER-CONNECTED TERMINAL

CROSS-REFERENCE TO RELATED APPLICATION

This application is based upon and claims the benefit of priority of the prior Japanese Patent Application No. 2020-109429, filed on Jun. 25, 2020, the entire contents of which are incorporated herein by reference.

BACKGROUND OF THE INVENTION

1. Field of the Invention

An embodiment discussed herein relates to a semiconductor device with a laser-connected terminal.

2. Background of the Related Art

There is a semiconductor device that includes a semiconductor module and a capacitor. The semiconductor module and the capacitor are electrically connected to each other. The semiconductor module includes power devices and has a power conversion function, for example. The power devices are insulated gate bipolar transistors (IGBTs) or metal-oxide-semiconductor field-effect transistors (MOSFETs), for example. In this semiconductor device, the P and N terminals of the semiconductor module and the P and N terminals of the capacitor are connected to each other via a bus bar. This connection has conventionally been made by screwing, to facilitate the connection process. However, if this connection method is used, the length of an individual wiring between the semiconductor module and the capacitor could be extended, and the inductance could consequently be increased. To address this problem, there has been proposed a connection method that achieves the connection more easily without using screws and that reduces the inductance (see, for example, Japanese Laid-open Patent Publication No. 2007-234694). According to Japanese Laid-open Patent Publication No. 2007-234694, reduction of the inductance is expected by a connection mechanism on the semiconductor module side. In addition, in this case, ultrasonic bonding is used to bond the connection terminals.

In some cases, a semiconductor module and a capacitor are bonded by welding. In these cases, for example, two stacked terminals are welded to each other. However, if a welded portion penetrates these two stacked terminals, a member disposed under these two stacked terminals is damaged. Such a damaged member becomes unable to fulfil its original function. For example, if an insulating member is disposed under these stacked terminals and an opening is made in the insulating member by welding, the insulation property of the insulating member is impaired. As a result, the reliability of the semiconductor device including the semiconductor module and the capacitor is deteriorated.

SUMMARY OF THE INVENTION

According to one aspect of the embodiment, there is provided a semiconductor device including: a capacitor; a semiconductor module, including a first power terminal formed on a front surface of a first insulating member; and a connecting member electrically connecting and mechanically coupling the semiconductor module and the capacitor to each other, the connecting member having a front surface and a rear surface opposite to each other, the rear surface being on a front surface of the first power terminal, wherein the connecting member is bonded to the semiconductor module via a first welded portion, which penetrates the front and rear surfaces of the connecting member, and penetrates the front surface of the first power terminal, in a thickness direction of the semiconductor device, a distance in the thickness direction between a bottommost portion of first welded portion and the front surface of the first insulating member being 0.3 mm or more.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 4A and 4B illustrate a capacitor according to the embodiment;

FIG. 11 is a table illustrating the insulation property with respect to the laser output according to the connection method of the semiconductor device according to the embodiment; and FIG. 12 is a table illustrating the welding property with respect to the laser output according to the connection method of the semiconductor device according to the embodiment.

DETAILED DESCRIPTION OF THE INVENTION

Figure 1:
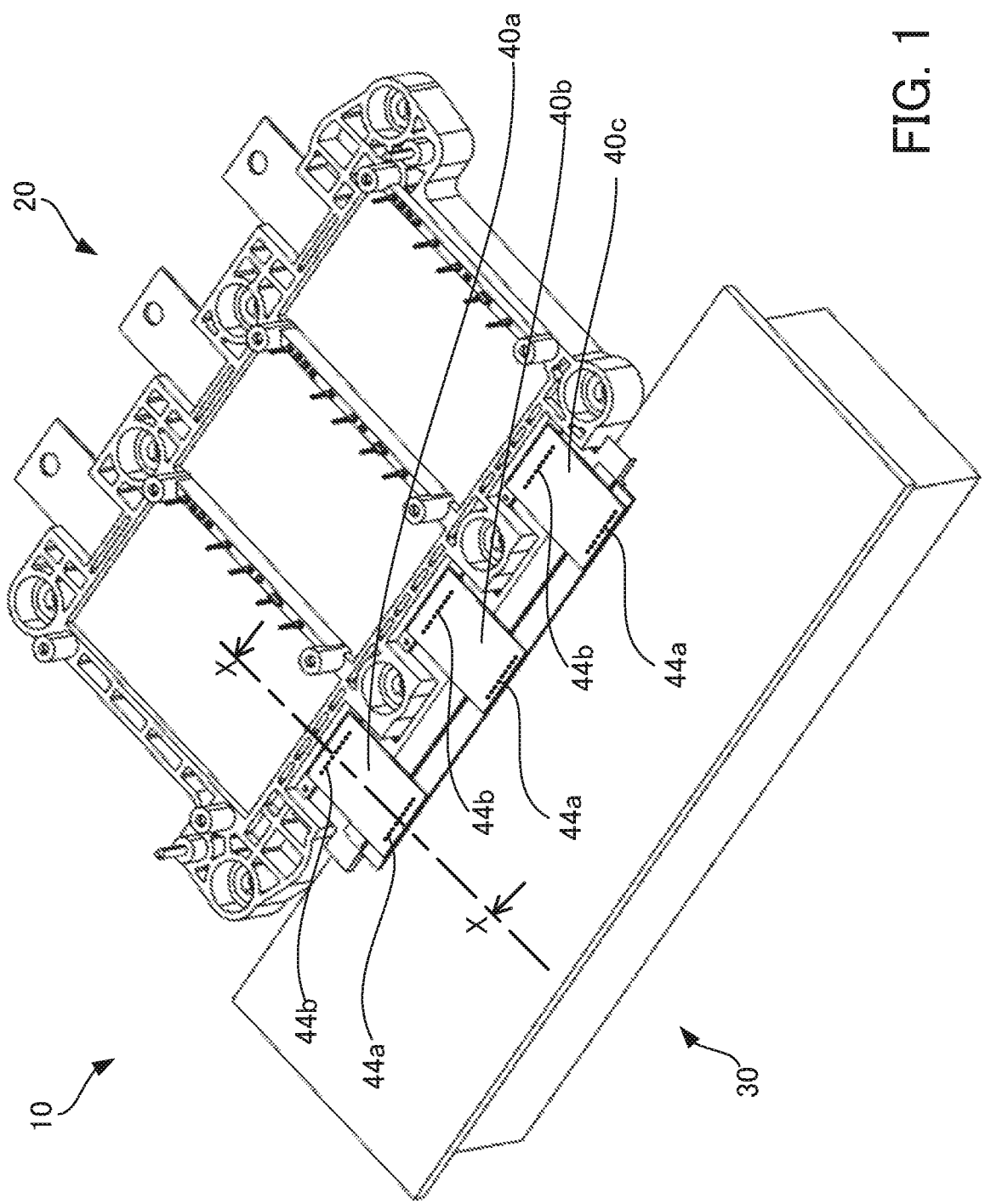
FIG. 1 illustrates a semiconductor device according to an embodiment.

Hereinafter, an embodiment will be described with reference to the accompanying drawings. In the following description, regarding a semiconductor device 10 in FIG. 1, terms "front surface" and "top surface" each mean an upward surface. Likewise, regarding the semiconductor device 10 in FIG. 1, a term "up" means an upward direction. In addition, regarding the semiconductor device 10 in FIG. 1, terms "rear surface" and "bottom surface" each mean a downward surface. Likewise, regarding the semiconductor device 10 in FIG. 1, a term "down" means a downward direction. In the drawings other than FIG. 1, the above terms mean their respective directions, as needed. The terms "front surface", "top surface", "up", "rear surface", "bottom surface", "down", and "side surface" are only expressions used for the purpose of convenience to determine relative positional relationships and do not limit the technical concept of the embodiment. For example, the terms "up" and "down" may mean directions other than the vertical directions with respect to the ground. That is, the directions expressed by "up" and "down" are not limited to the directions relating to the gravitational force.

A semiconductor device according to an embodiment will be described with reference to FIG. 1. FIG. 1 illustrates a semiconductor device according to an embodiment. This semiconductor device 10 includes a semiconductor module 20 and a capacitor 30. The semiconductor module 20 and the capacitor 30 are disposed as close to each other as possible so that their sides face each other. Connecting members 40a, 40b, and 40c electrically connect and mechanically couple the semiconductor module 20 and the capacitor 30 with each other. Each of these connecting members 40a, 40b, and 40c has a line of dotted laser welding marks 44a on its edge close to the capacitor 30 and a line of dotted laser welding marks 44b on its edge close to the semiconductor module 20. These laser welding marks 44a and 44b will be described below. The number of connecting members 40a, 40b, and 40c and the width thereof are only examples. The number and the width are selected based on the number of stacked terminal portions 25a, 25b, and 25c (which will be described below) and the width thereof included in the semiconductor module 20. Hereinafter, when the connecting members 40a, 40b, and 40c do not need to be distinguished from each other, any one of the connecting members will simply be referred to as a connecting member 40, as needed. Likewise, when the stacked terminal portions 25a, 25b, and 25c do not need to be distinguished from each other, any one of the stacked terminal portions will simply be referred to as a stacked terminal portion 25, as needed.

Figure 2:
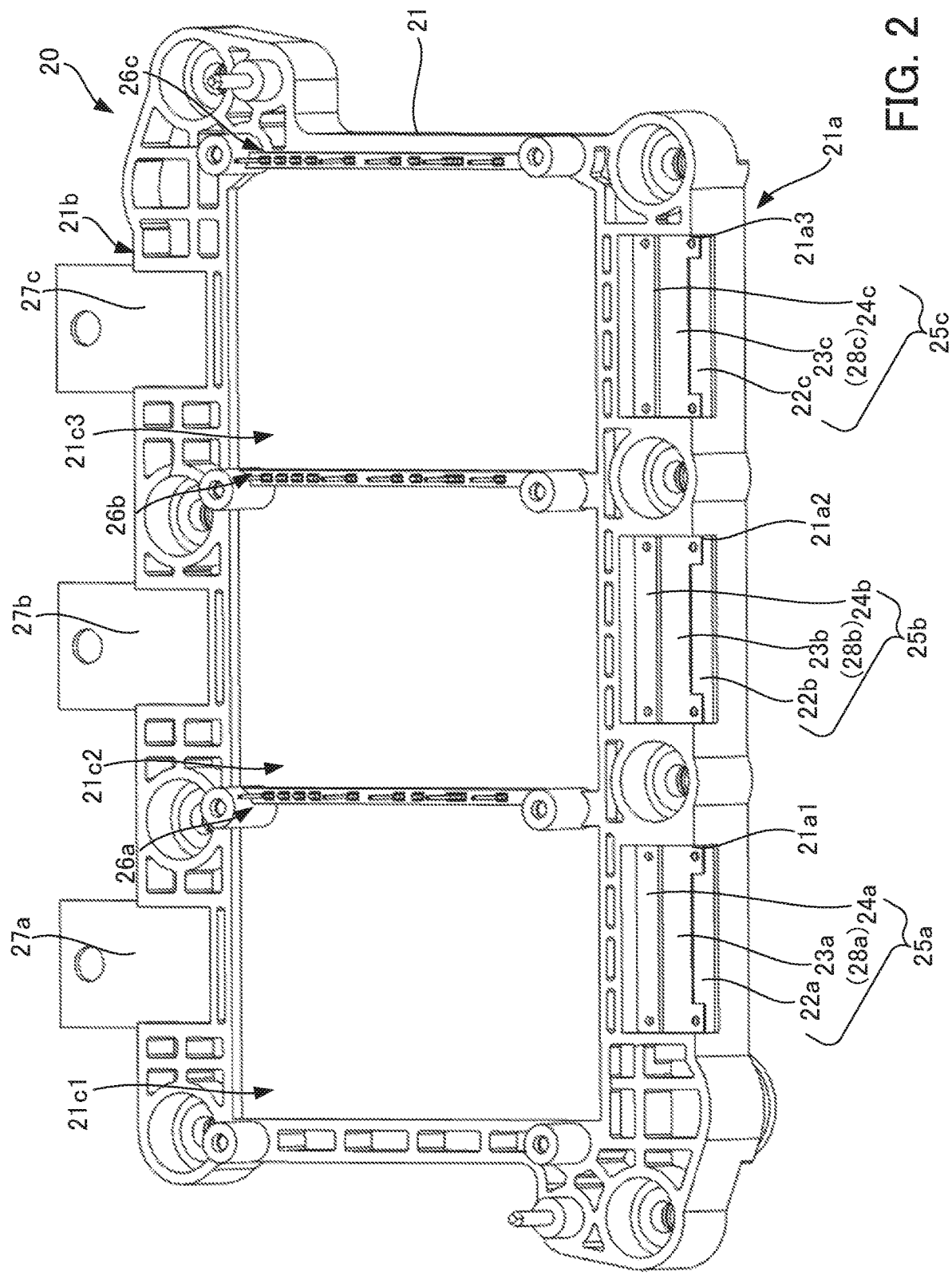
FIG. 2 illustrates a semiconductor module according to the embodiment.
Figure 3:
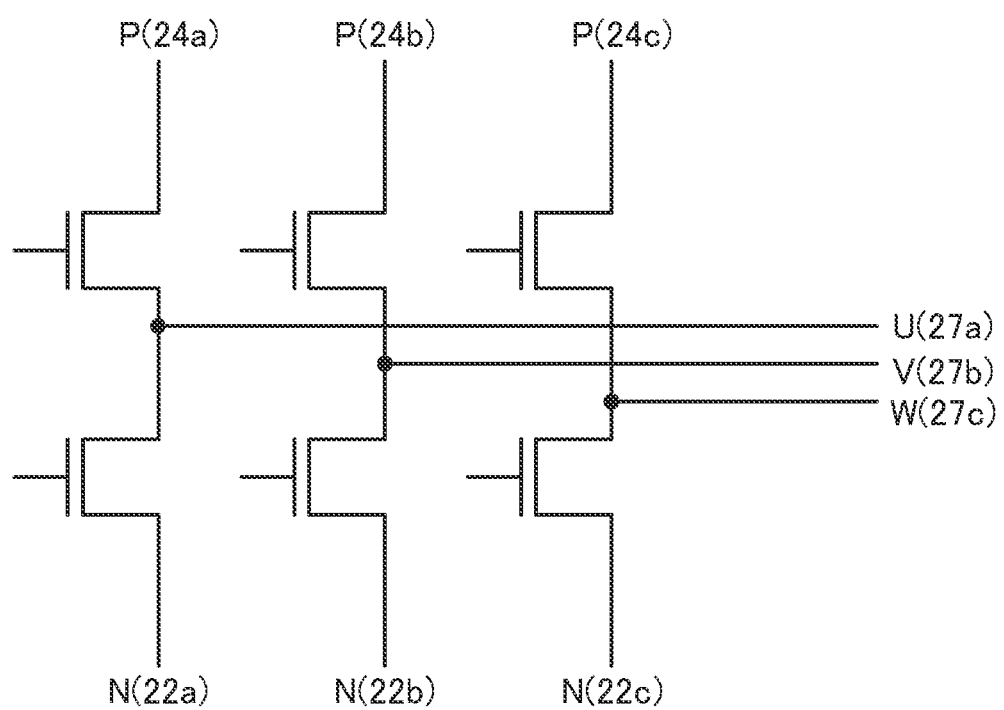
FIG. 3 illustrates an equivalent circuit of the semiconductor module of the semiconductor device according to the embodiment.

Next, the semiconductor module 20 included in the semiconductor device 10 will be described with reference to FIGS. 2 and 3. FIG. 2 illustrates the semiconductor module according to the embodiment, and FIG. 3 illustrates an equivalent circuit of the semiconductor module of the semiconductor device according to the embodiment.

The semiconductor module 20 includes semiconductor units (not illustrated) and a case 21 in which the semiconductor units are stored. Each of the semiconductor units includes a ceramic circuit board and first and second semiconductor chips formed on the ceramic circuit board. The ceramic circuit board includes an insulating plate, a heat radiation plate formed on the rear surface of the insulating plate, and a plurality of circuit patterns formed on the front surface of the insulating plate. The insulating plate is made of ceramic material having excellent thermal conductivity. Examples of this ceramic material include aluminum oxide, aluminum nitride, and silicon nitride having high-temperature conductivity. The heat radiation plate is made of metal material having excellent thermal conductivity. Examples of the metal material include aluminum, iron, silver, copper, and an alloy containing at least one kind of these elements. The individual circuit pattern is made of metal material having excellent electrical conductivity. Examples of the metal material include copper and a copper alloy. The number of circuit patterns and the shape thereof are suitably selected based on the specifications of the semiconductor module 20, for example. For example, a direct copper bonding (DCB) substrate or an active metal brazed (AMB) substrate may be used as the individual ceramic circuit board having the above configuration.

The individual first semiconductor chip is a switching element made of silicon or silicon carbide. The switching element is, for example, an IGBT or a power MOSFET. The first semiconductor chip includes, for example, a drain electrode (or a collector electrode) as a main electrode on its rear surface and a gate electrode and a source electrode (or an emitter electrode) as main electrodes on its front surface. The individual second semiconductor chip is a diode electrode made of silicon or silicon carbide. The diode electrode is, for example, a free wheeling diode (FWD) such as a Schottky barrier diode (SBD) or a P-intrinsic-N (PiN) diode. The second semiconductor chip includes a cathode electrode as a main electrode on its rear surface and an anode electrode as a main electrode on its front surface. Alternatively, reverse-conducting (RC)-IGBTs, each of which has functions of both an IGBT and an FWB, may be used as the first and second semiconductor chips. The number of semiconductor chips and the kind thereof are also suitably selected based on the specifications of the semiconductor module 20.

The case 21 includes storage areas 21c1, 21c2, and 21c3. In addition, the case 21 includes second power terminals 22a, 22b, and 22c, first insulating sheets 23a, 23b, and 23c, and first power terminals 24a, 24b, and 24c. In addition, the case 21 includes a U terminal 27a, a V terminal 27b, and a W terminal 27c. This case 21 is formed by injection molding using thermo-flexible resin. In addition, control terminals 26a, 26b, and 26c are attached to side portions of the storage areas 21c1, 21c2, and 21c3 (in parallel with the lateral sides of the case 21). For example, the thermo-flexible resin is polyphenylenesulfide (PPS) resin, polybutyleneterephthalate (PBT) resin, polybutylene succinate (PBS) resin, polyamide (PA) resin, or acrylonitrile butadiene styrene (ABS) resin. The control terminals 26a, 26b, and 26c are also formed by injection molding using thermal flexible resin, including predetermined terminals. When the storage areas 21c1, 21c2, and 21c3 do not need to be distinguished from each other, any one of these storage areas will simply be referred to as a storage areas 21c. Likewise, when the second power terminals 22a, 22b, and 22c do not need to be distinguished from each other, any one of these second power terminals will simply be referred to as a second power terminal 22. Likewise, when the first power terminals 24a, 24b, and 24c do not need to be distinguished from each other, any one of the first power terminals will simply be referred to as a first power terminal 24. Likewise, any one of the first insulating sheets 23a, 23b, and 23c to be described below will simply be referred to as a first insulating sheet 23.

Each of the storage areas 21c1, 21c2, and 21c3 is a space formed in the middle portion of the case 21 in the longitudinal direction thereof in a planar view. Each of the storage areas 21c1, 21c2, and 21c3 includes a semiconductor unit described above. The semiconductor unit inside the storage area 21cl is electrically connected to the second power terminal 22a, the first power terminal 24a, and the U terminal 27a. The semiconductor unit inside the storage area 21c2 is electrically connected to the second power terminal 22b, the first power terminal 24b, and the V terminal 27b. The semiconductor unit inside the storage area 21c3 is electrically connected to the second power terminal 22c, the first power terminal 24c, and the W terminal 27c. These semiconductor units are also electrically connected to their respective control terminals 26a, 26b, and 26c. For this electrical connection, wiring members such as bonding wires or lead frames are used. The wiring members are made of material having excellent electrical conductivity. Examples of the material include metal material such as aluminum or copper and an alloy containing at least one kind of these elements. After the semiconductor units are stored in their respective storage areas 21c1, 21c2, and 21c3, the inside of each of the storage areas 21c1, 21c2, and 21c3 is sealed by sealing resin, as illustrated in FIG. 2. The sealing material includes thermosetting resin and filler included therein. Examples of the thermosetting resin include epoxy resin, phenolic resin, and maleimide resin. Examples of the filler include silicon oxide, aluminum oxide, boron nitride, and aluminum nitride.

A first end portion of the front surface of the second power terminal 22a is exposed to the outside in a terminal area 21a1 of a first side portion 21a of the case 21 in the longitudinal direction. A first end portion of the front surface of the second power terminal 22b is exposed to the outside in a terminal area 21a2 of the first side portion 21a of the case 21 in the longitudinal direction. A first end portion of the front surface of the second power terminal 22c is exposed to the outside in a terminal area 21a3 of the first side portion 21a of the case 21 in the longitudinal direction. A second end portion of each of the second power terminals 22a, 22b, and 22c is electrically connected to a portion corresponding to an N terminal of a corresponding semiconductor chip inside the case 21. At least the first end portion of each of the second power terminals 22a, 22b, and 22c on the first side portion 21a has a planar shape. The second power terminals 22a, 22b, and 22c are made of metal material having excellent electrical conductivity. Examples of the metal material include copper and a copper alloy.

The first power terminals 24a, 24b, and 24c are formed on the second power terminals 22a, 22b, and 22c via the first insulating sheets 23a, 23b, and 23c, respectively, and the first end portions of the second power terminals 22a, 22b, and 22c are exposed to the outside. Tip portions (terrace portions 28a, 28b, and 28c) of the first insulating sheets 23a, 23b, and 23c are located between tip portions of the second power terminals 22a, 22b, and 22c and tip portions of the first power terminals 24a, 24b, and 24c. In this way, the insulation property between the second power terminals 22a, 22b, and 22c and the first power terminals 24a, 24b, and 24c is maintained. The first insulating sheets 23a, 23b, and 23c are made of insulating material having an insulation property. For example, insulating paper made of wholly aromatic polyamide polymer or sheet insulating material made of fluorine or polyimide resin material may be used as the insulating material. When the terrace portions 28a, 28b, and 28c do not need to be distinguished from each other, any one of the terrace portions will simply be referred to as a terrace portion 28. A first end portion of the front surface of each of the first power terminals 24a, 24b, and 24c is exposed to the outside on the first side portion 21a of the case 21 in the longitudinal direction. A second end portion of each of the first power terminals 24a, 24b, and 24c is electrically connected to a portion corresponding to a P terminal of a corresponding semiconductor chip inside the case 21. At least the first end portion of each of the first power terminals 24a, 24b, and 24c on the first side portion 21a has a planar shape. The first power terminals 24a, 24b, and 24c are made of metal material having excellent electrical conductivity. Examples of this metal material include copper and a copper alloy.

As described above, the second power terminals 22a, 22b, and 22c, the first insulating sheets 23a, 23b, and 23c, and the first power terminals 24a, 24b, and 24c are sequentially stacked to form the stacked terminal portions 25a, 25b, and 25c, respectively. The above edge portions of the front surfaces of the second power terminals 22a, 22b, and 22c, the first insulating sheets 23a, 23b, and 23c, and the first power terminals 24a, 24b, and 24c on the first side portion 21a are exposed to the outside. In addition, as will be illustrated in FIG. 5, the tip portions of the second power terminals 22a, 22b, and 22c (the second power terminal 22 in FIG. 5) are separated from the tip portions of the first power terminals 24a, 24b, and 24c (the first power terminal 24 in FIG. 5) by a predetermined distance. Consequently, the creepage distance between the second power terminals 22a, 22b, and 22c and the first power terminals 24a, 24b, and 24c is maintained. This distance differs depending on the withstand voltage value of the semiconductor device 10. The distance is, for example, between 3 mm and 14.5 mm, inclusive. Alternatively, the distance may be between 6 mm and 12.5 mm, inclusive. Regarding this distance, when the withstand voltage value is 750 V, a tolerance of 0.5 mm may be added to 7.5 mm. When the withstand voltage value is 1,200 V, a tolerance of 0.5 mm may be added to 12 mm. Tip portions of the first insulating sheets 23a, 23b, and 23c are located in this creepage distance.

A first end portion of each of the control terminals 26a, 26b, and 26c extends upward in FIG. 2. In addition, a second end portion of each of the control terminals 26a, 26b, and 26c is electrically connected to a gate electrode of a semiconductor chip of a semiconductor unit in the corresponding one of the storage areas 21c1, 21c2, and 21c3. The control terminals 26a, 26b, and 26c are made of metal material having excellent electrical conductivity. Examples of this metal material include copper, a copper alloy, aluminum, and an aluminum alloy.

A second end portion of each of the U terminal 27a, the V terminal 27b, and the W terminal 27c is electrically connected to a source electrode (or an emitter electrode) of a semiconductor chip of an upper arm and a drain electrode (or a collector electrode) of a semiconductor chip of a lower arm of a semiconductor unit in the corresponding one of the storage areas 21c1, 21c2, and 21c3. A first end portion of each of the U terminal 27a, the V terminal 27b, and the W terminal 27c is exposed to the outside at a second side portion 21b of the case 21 in the longitudinal direction of the case 21. The U terminal 27a, the V terminal 27b, and the W terminal 27c are made of metal material having excellent electrical conductivity. Examples of this metal material include copper and a copper alloy.

FIG. 3 illustrates an equivalent circuit of the semiconductor module 20. The equivalent circuit in FIG. 3 includes switching elements, and power MOSFETs or IGBTs may be used as the semiconductor chips. In the semiconductor device 10, the first power terminals 24a, 24b, and 24c functioning as P terminals are electrically connected to the drain electrodes (or the collector electrodes) of the first semiconductor chips of the upper arm of the semiconductor units in their respective storage areas 21c1, 21c2, and 21c3. The U terminal 27a, the V terminal 27b, and the W terminal 27c are electrically connected to the source electrodes (or the emitter electrodes) of the first semiconductor chips of the upper arm and the drain electrodes (or the collector electrodes) of the second semiconductor chips of the lower arm of the semiconductor units in their respective storage areas 21c1, 21c2, and 21c3. In addition, the second power terminals 22a, 22b, and 22c functioning as N terminals are electrically connected to the source electrodes (or the emitter electrodes) of the second semiconductor chips of the lower arm of the semiconductor units in their respective storage areas 21c1, 21c2, and 21c3.

Next, the capacitor 30 will be described with reference to FIGS. 4A and 4B. FIGS. 4A and 4B illustrate the capacitor according to the embodiment. FIG. 4A is a perspective view of the capacitor 30, and FIG. 4B is a perspective view of the capacitor 30 seen from the opposite direction of that in FIG. 4A. The capacitor 30 includes a case 31, a first connection terminal 34, a second insulating sheet 33, and a second connection terminal 32.

The case 31 is the main body of the capacitor. For example, the case 31 may hold a plurality of capacitor elements, each of which is formed by stacking and winding a pair of film dielectrics and connecting the film dielectrics to positive and negative electrodes. Thus, the case 31 is insulated from the capacitor elements and is made of lightweight material. This material is epoxy resin, for example. A second end portion of the second connection terminal 32 is electrically connected to the N electrodes of all the capacitor elements inside the case 31. A first end portion of the second connection terminal 32 extends to the outside from a third side portion 31a of the case 31. This portion of the second connection terminal 32 extending from the case 31 has an approximately L shape in a lateral view. The second connection terminal 32 having the approximately L shape includes a first conductive portion 321 and a first wiring portion 322, as will be described below with reference to FIG. 5. A second end portion of the first conductive portion 321 is electrically connected to the N electrodes of the capacitor elements inside the case 31, and the first conductive portion 321 vertically extends to the outside from the front surface of the case 31. The first wiring portion 322 is approximately perpendicular to the first conductive portion 321 and extends in the direction of the third side portion 31a approximately in parallel with the front surface of the case 31. In addition, the portion of the second connection terminal 32 extending from the case 31 (the first wiring portion 322) has a comb-teeth shape having segments referred to as a first connection portion 32a, a second connection portion 32b, and a third connection portion 32c in a planar view. In FIG. 4B, the reference characters of the first connection portion 32a, the second connection portion 32b, and the third connection portion 32c are not illustrated. The widths of the first connection portion 32a, the second connection portion 32b, and the third connection portion 32c are narrower than the widths of the first insulating sheets 23a, 23b, and 23c of the storage areas 21c1, 21c2, and 21c3 (the second power terminals 22a, 22b, and 22c) of the semiconductor module 20, respectively. Tip portions of the first connection portion 32a, the second connection portion 32b, and the third connection portion 32c are disposed in concave portions of the first insulating sheets 23a, 23b, and 23c illustrated in FIG. 2, respectively. The individual second connection terminal 32 is made of metal material having excellent electrical conductivity. Examples of the metal material include copper and a copper alloy.

A second end portion of the first connection terminal 34 is electrically connected to the P electrodes of all the capacitor elements within the case 31. A first end portion of the first connection terminal 34 extends to the outside from the third side portion 31a of the case 31. The first connection terminal 34 is formed with a gap from the second connection terminal 32 and extends in the opposite direction of the third side portion 31a. The portion of the first connection terminal 34 extending from the case 31 has an approximately L shape in a lateral view. The first connection terminal 34 having the approximately L shape includes a second conductive portion 341 and a second wiring portion 342, as will be described with reference to FIG. 5. A second end portion of the second conductive portion 341 is electrically connected to the P electrodes of the capacitor elements within the case 31, and the second conductive portion 341 vertically extends to the outside from the front surface of the case 31. The second wiring portion 342 is approximately perpendicular to the second conductive portion 341 and extends to the opposite side of the third side portion 31a approximately in parallel with the front surface of the case 31. The first connection terminal 34 is made of metal material having excellent electrical conductivity. Examples of the metal material include copper and a copper alloy.

The second insulating sheet 33 extends longer to the outside than the second connection terminal 32 and is wider than the first connection terminal 34 and the second connection terminal 32. In addition, the second insulating sheet 33 extends to the outside between the second connection terminal 32 and the first connection terminal 34 of the case 31. The widths of the first attachment portion 33a, the second attachment portion 33b, and the third attachment portion 33c of the second insulating sheet 33 are wider than the widths of the first connection portion 32a, the second connection portion 32b, and the third connection portion 32c of the second connection terminal 32. That is, the outer edge of the second insulating sheet 33 extends more outwardly than the outer edge of the second connection terminal 32. In addition, the widths of the connecting members 40a, 40b, and 40c are narrower than the widths of the first attachment portion 33a, the second attachment portion 33b, and the third attachment portion 33c of the second insulating sheet 33. Thus, outside the case 31, the insulation property between the second connection terminal 32 and the first connection terminal 34 connected to the connecting members 40a, 40b, and 40c is maintained by the second insulating sheet 33. The second insulating sheet 33 is made of flexible insulating material having an insulation property. For example, insulating paper made of wholly aromatic polyamide polymer or sheet insulating material made of fluorine or polyimide resin material may be used as the insulating material. In addition, a tip portion of the second insulating sheet 33 has a comb-teeth shape having segments referred to as a first attachment portion 33a, a second attachment portion 33b, and a third attachment portion 33c in a planar view. In FIG. 4B, the reference characters of the first attachment portion 33a, the second attachment portion 33b, and the third attachment portion 33c are not illustrated. The widths of the first attachment portion 33a, the second attachment portion 33b, and the third attachment portion 33c correspond to the widths of the storage areas 21c1, 21c2, and 21c3 (the first insulating sheets 23a, 23b, and 23c) of the semiconductor module 20.

While not illustrated, the case 31 is provided with additional terminals. These terminals have second end portions that are electrically connected to the positive and negative terminals of all the capacitor elements inside the case 31. These terminals have first end portions that extend to the outside from the case 31. These terminals may extend from any locations of the case 31, as long as the locations are different from where the second connection terminal 32 and the first connection terminal 34 extend. For example, these terminals may be formed on the side portion opposite to the third side portion 31a. The terminals are made of metal material having excellent electrical conductivity. Examples of the metal material include copper and a copper alloy.

Next, the connecting members 40a, 40b, and 40c will be described (see FIG. 1). Each of the connecting members 40a, 40b, and 40c has a planar shape in a planar view. The width of a first end portion of each of the connecting members 40a, 40b, and 40c is narrower than the width of the concave portion (the corresponding one of the storage areas 21c1, 21c2, and 21c3) in the case 21 in the storage areas 21c1, 21c2, and 21c3 (the first power terminals 24a, 24b, and 24c) of the semiconductor module 20. The thickness of each of the connecting members 40a, 40b, and 40c is less than the thickness of each of the first power terminals 24a, 24b, and 24c. The thicknesses of the connecting members 40a, 40b, and 40c and the first power terminals 24a, 24b, and 24c will be descried below. The first end portion of each of the connecting members 40a, 40b, and 40c is bonded to the corresponding one of the first power terminals 24a, 24b, and 24c by laser welding. A second end portion of each of the connecting members 40a, 40b, and 40c is bonded to the first connection terminal 34 of the capacitor 30 by laser welding. The bonding by the laser welding may be performed by seam laser in which laser light is continuously emitted or spot laser in which pulsed laser light is emitted. FIG. 1 illustrates a case in which the bonding is made by spot laser. Thus, each of the connecting members 40a, 40b, and 40c in FIG. 1 has dotted laser welding marks 44a near the capacitor 30 and dotted laser welding marks 44b near the semiconductor module 20 (linear laser welding marks are formed if seam laser is used). The connecting members 40a, 40b, and 40c are made of metal material having excellent electrical conductivity. Examples of the metal material include copper and a copper alloy. According to the embodiment, the three connecting members 40a, 40b, and 40c are bonded to the first power terminals 24a, 24b, and 24c, respectively.

Alternatively, as is the case with the second connection terminal 32 and the second insulating sheet 33, a plate-like connecting member 40 having an end portion in a comb-teeth shape near the semiconductor module 20 may be used. In this case, the end portion has segments serving as the connecting members 40a, 40b, and 40c corresponding to the first power terminals 24a, 24b, and 24c.

Figure 5:
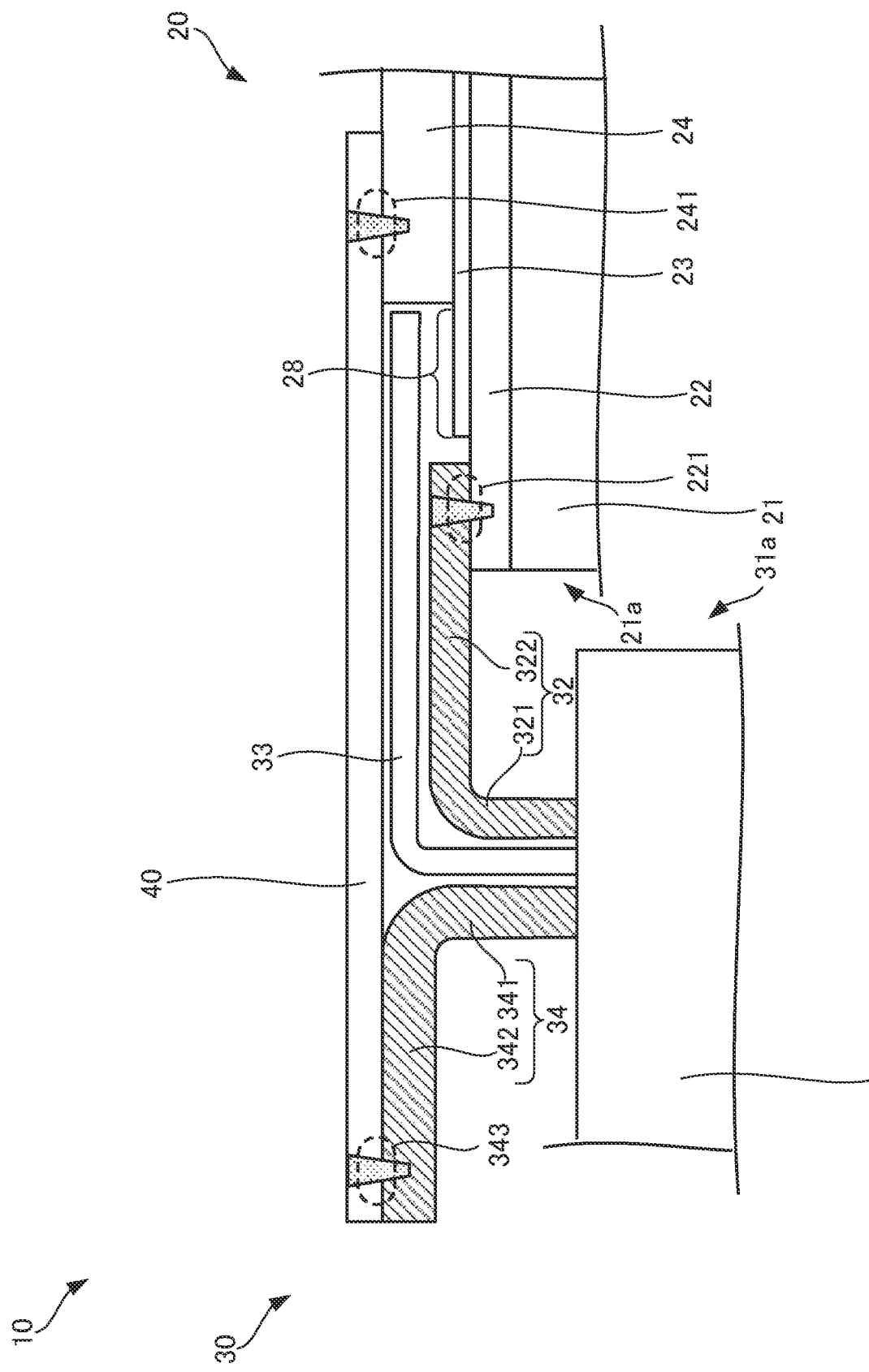
FIG. 5 is a sectional view illustrating a connection mechanism included in the semiconductor device according to the embodiment.

Next, a connection mechanism between the semiconductor module 20 and the capacitor 30 of the semiconductor device 10 will be described with reference to FIG. 5. FIG. 5 is a sectional view illustrating the connection mechanism included in the semiconductor device according to the embodiment. FIG. 5 is a sectional view taken along an alternate long and short dash line X-X in FIG. 1. The other connecting members 40b and 40c of the semiconductor device 10 in FIG. 1 have the same cross section as that in FIG. 5.

In the semiconductor device 10, the first wiring portion 322 of the second connection terminal 32 of the capacitor 30 is bonded to second bonding regions 221 of the individual second power terminals 22 of the semiconductor module 20. Namely, while not illustrated, the first connection portion 32a, the second connection portion 32b, and the third connection portion 32c of the first wiring portion 322 of the second connection terminal 32 are bonded to the individual second bonding regions 221 of the second power terminals 22a, 22b, and 22c of the semiconductor module 20. The term "second bonding region 221" collectively denotes any one of the second bonding regions of the second power terminals 22a, 22b, and 22c.

The second insulating sheet 33 of the capacitor 30 bends towards the semiconductor module 20 and extends over the second connection terminal 32. The tip portion of the second insulating sheet 33 extends above the terrace portions 28 of the individual first insulating sheets 23 of the semiconductor module 20. The tip portion of the second insulating sheet 33 extends up to a location immediately before the first power terminals 24. That is, there is a gap between the individual terrace portion 28 and the tip portion of the second insulating sheet 33 or between the tip portion of the second insulating sheet 33 and the individual connecting member 40. In addition, the gap between the tip portion of the second connection terminal 32 and the tip portion of the individual first power terminal 24 may be suitably set based on the needed withstand voltage value. The gap is, for example, between 6 mm and 12.5 mm, inclusive. The individual terrace portion 28 extends towards the corresponding second bonding region 221 to be described below from the corresponding first bonding region 241 to be described below in a planar view. In addition, while not illustrated, the first attachment portion 33a, the second attachment portion 33b, and the third attachment portion 33c of the tip portion of the first insulating sheet 23 extend above the respective first insulating sheets 23a, 23b, and 23c of the semiconductor module 20.

The front surface of the second wiring portion 342 of the first connection terminal 34 of the capacitor 30 and the front surface of the individual first power terminals 24 of the semiconductor module 20 are on the same plane. In addition, the first end portion of the individual connecting member 40 is bonded to a third bonding region 343 of the second wiring portion 342 of the first connection terminal 34 of the capacitor 30, and a second end portion of the individual connecting member 40 is bonded to the first bonding region 241 of the corresponding first power terminal 24 of the semiconductor module 20. The first bonding regions 241 and the third bonding regions 343 are disposed in parallel with the second bonding regions 221. While not illustrated, the second end portion of each of the connecting members 40a, 40b, and 40c is bonded to a corresponding one of the first bonding regions 241 of the first power terminals 24a, 24b, and 24c of the semiconductor module 20. The first bonding region 241 collectively denotes any one of the first bonding regions of the first power terminals 24a, 24b, and 24c. In this way, the connecting members 40 electrically connect the first connection terminal 34 of the capacitor 30 and the first power terminals 24 of the semiconductor module 20. The first bonding regions 241 will be described below in detail. There is a gap between the rear surface of the individual connecting member 40 and the front surface of the first wiring portion 322 of the second connection terminal 32 of the capacitor 30. The second insulating sheet 33 is formed in this gap. Thus, the second connection terminal 32 is insulated from the connecting members 40 and the first connection terminal 34. The configuration of the second insulating sheet 33 is not limited to that illustrated in FIG. 5. For example, the second insulating sheet 33 may be into contact with the rear surface of the individual connecting member 40, the front surface of the second connection terminal 32, or the tip portions of the first power terminals 24 in this gap.

Figure 6:
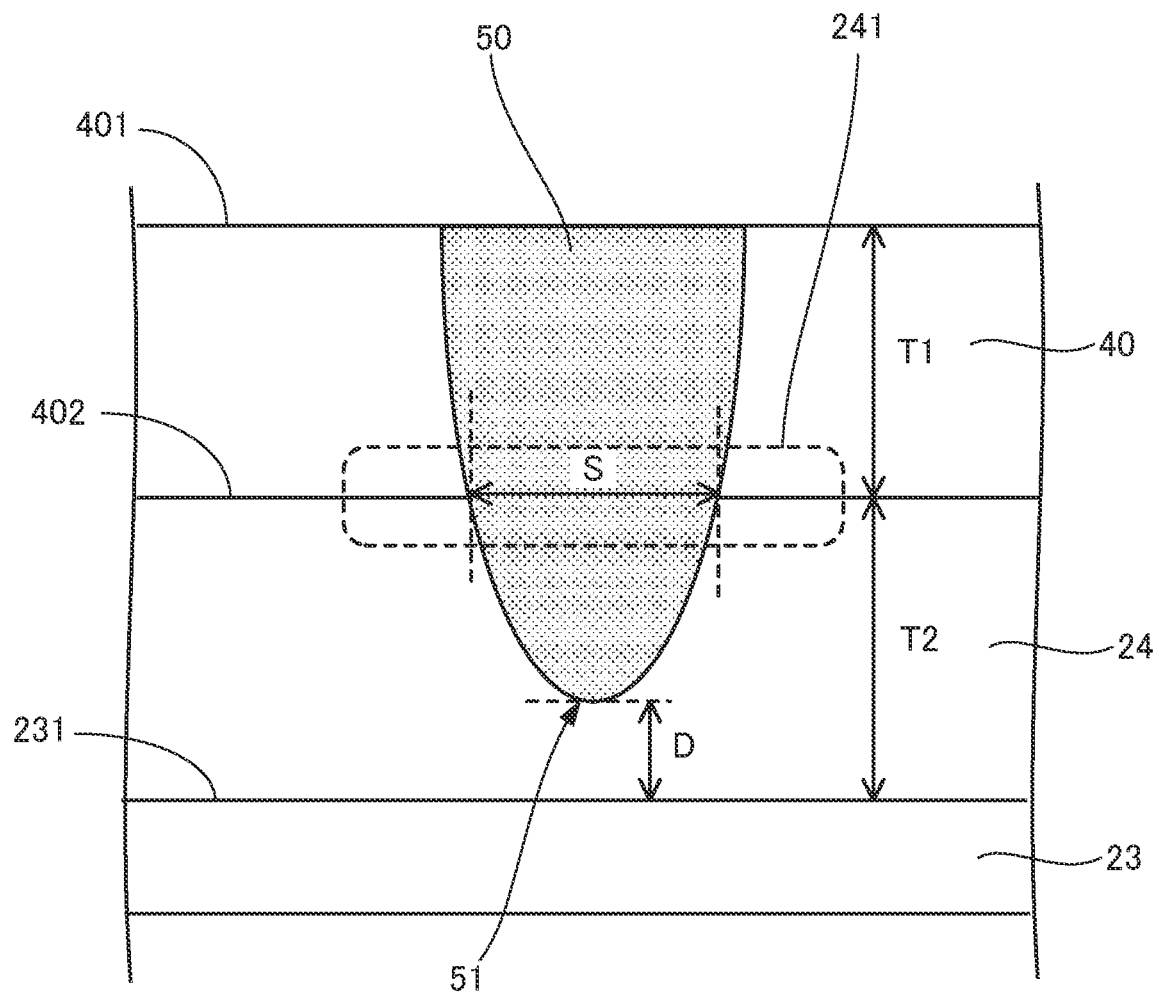
FIG. 6 is a sectional view of a main part of a welded portion included in the semiconductor device according to the embodiment.

Next, the welding in a first bonding region 241 will be described with reference to FIG. 6. FIG. 6 is a sectional view of a main part of a welded portion included in the semiconductor device according to the embodiment. FIG. 6 is an enlarged sectional view of the welded portion 50 that bonds the connecting member 40 and the first power terminal 24 stacked in the first bonding region 241 in FIG. 5. This welded portion 50 described herein is a single spot formed when welding is performed by spot laser.

The first power terminal 24 is disposed on a front surface 231 (a second front surface) of the first insulating sheet 23, and a rear surface 402 (a first rear surface) of the connecting member 40 is disposed on the first power terminal 24. The individual connecting member 40 has a thickness T1, which is approximately 0.8 mm. The individual first power terminal 24 has a thickness T2, which is 1.0 mm or 1.2 mm. In addition, regarding the first bonding region 241, the welded portion 50 penetrates the connecting member 40 from a front surface 401 (a first front surface) 401 vertically downward in FIG. 6. That is, the welded portion 50 penetrates the connecting member 40 through the front surface 401 and the rear surface 402 and into the first power terminal 24. In this way, the connecting member 40 and the first power terminal 24 is bonded by the welded portion 50. A bottommost portion 51, which corresponds to the penetration depth of the welded portion 50, is away from the front surface 231 of the first insulating sheet 23 by a distance D, which is 0.3 mm or more. Thus, the welded portion 50 does not reach the first insulating sheet 23. That is, since the first insulating sheet 23 is not damaged by the welded portion 50, the insulation between the first power terminal 24 and the second power terminal 22 is maintained. Other than the case as illustrated in FIG. 6, for example, even in a case where the second power terminals 22 and the second connection terminals 32 are sequentially stacked on the front surface of the case 21 and where the second power terminals 22 and second connection terminals 32 stacked are welded in their respective second bonding regions 221, the second power terminals 22 and second connection terminals 32 may be bonded by their respective welded portions 50 in the same way as described above. In this case, the bottommost portion 51 of the welded portion 50 in the second bonding region 221 is away from the surface of the case 21 on which the second power terminal 22 is disposed by 0.3 mm or more.

In addition, in the case of FIG. 6, a welded area S on the rear surface 402 of the connecting member 40 of the (single) welded portion 50 is 0.22 mm² or more. Since the welded portion 50 is formed to include this welded area S, sufficient bonding strength between the connecting member 40 and the first power terminal 24 is maintained. The bonding strength in this case is 20 N or more. The laser welding in FIG. 6 will be described in detail below.

Figure 7:
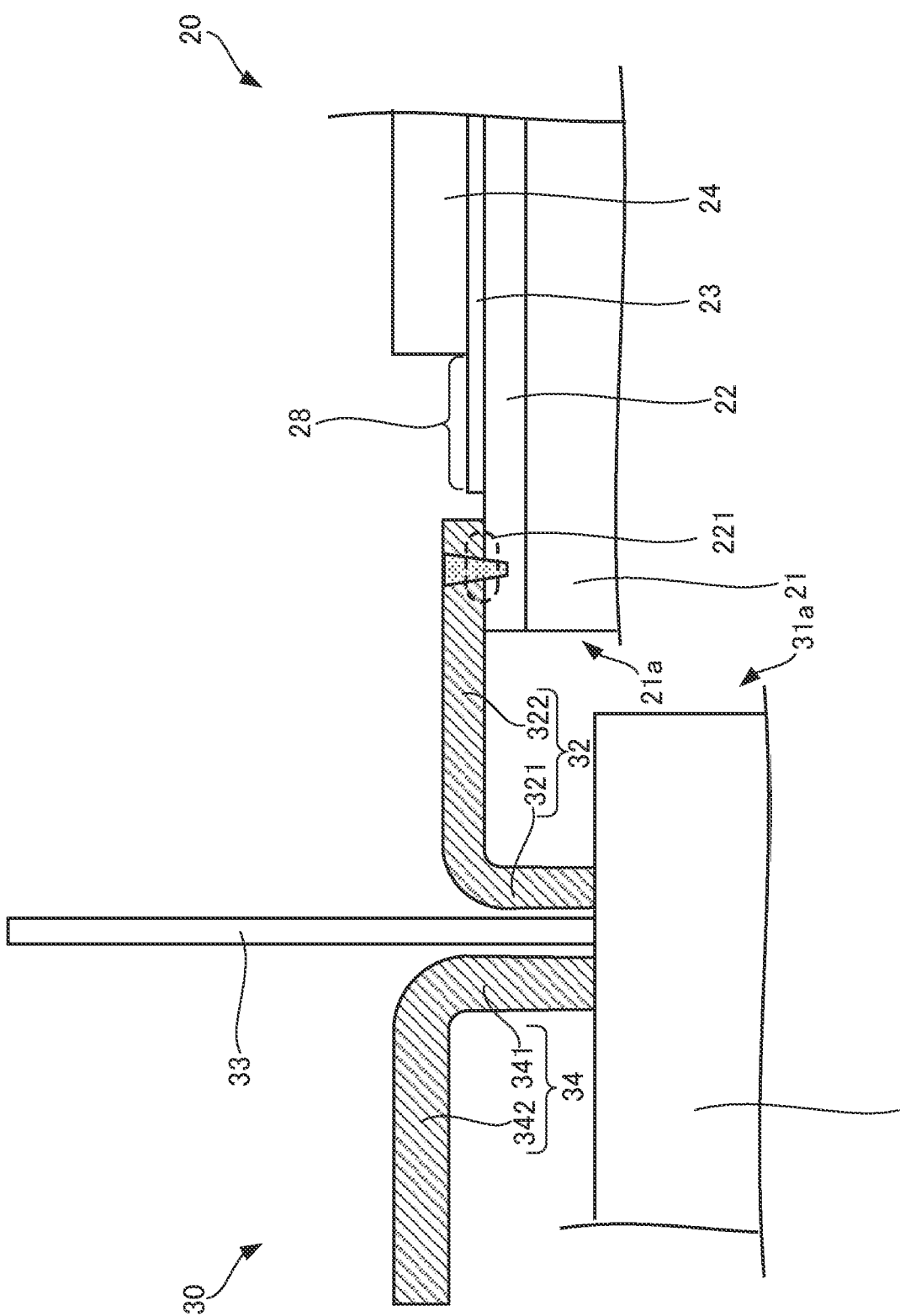
FIG. 7 is a first sectional view illustrating a connection method of the semiconductor device according to the embodiment.
Figure 8:
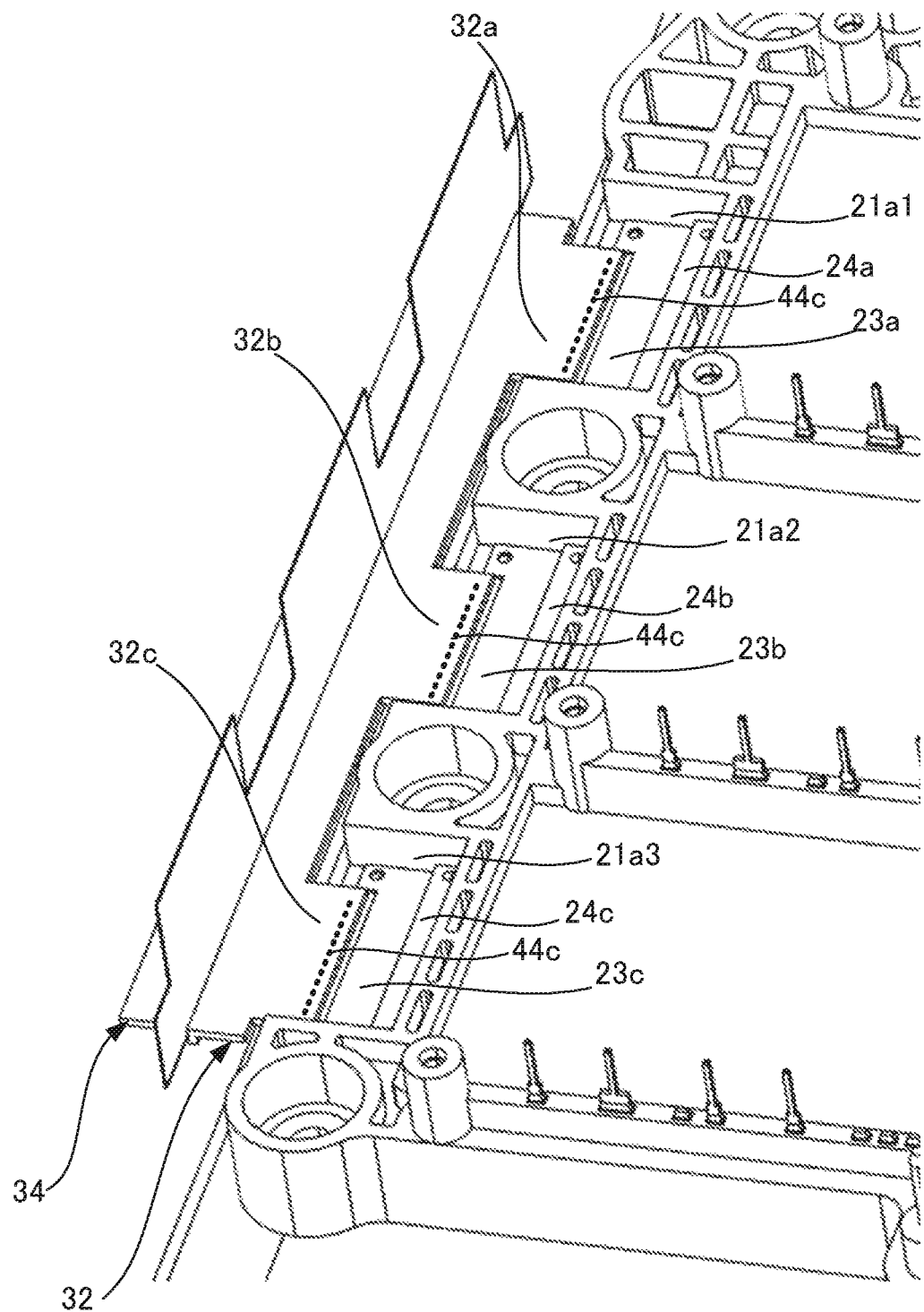
FIG. 8 is a first perspective view illustrating the connection method of the semiconductor device according to the embodiment.
Figure 9:
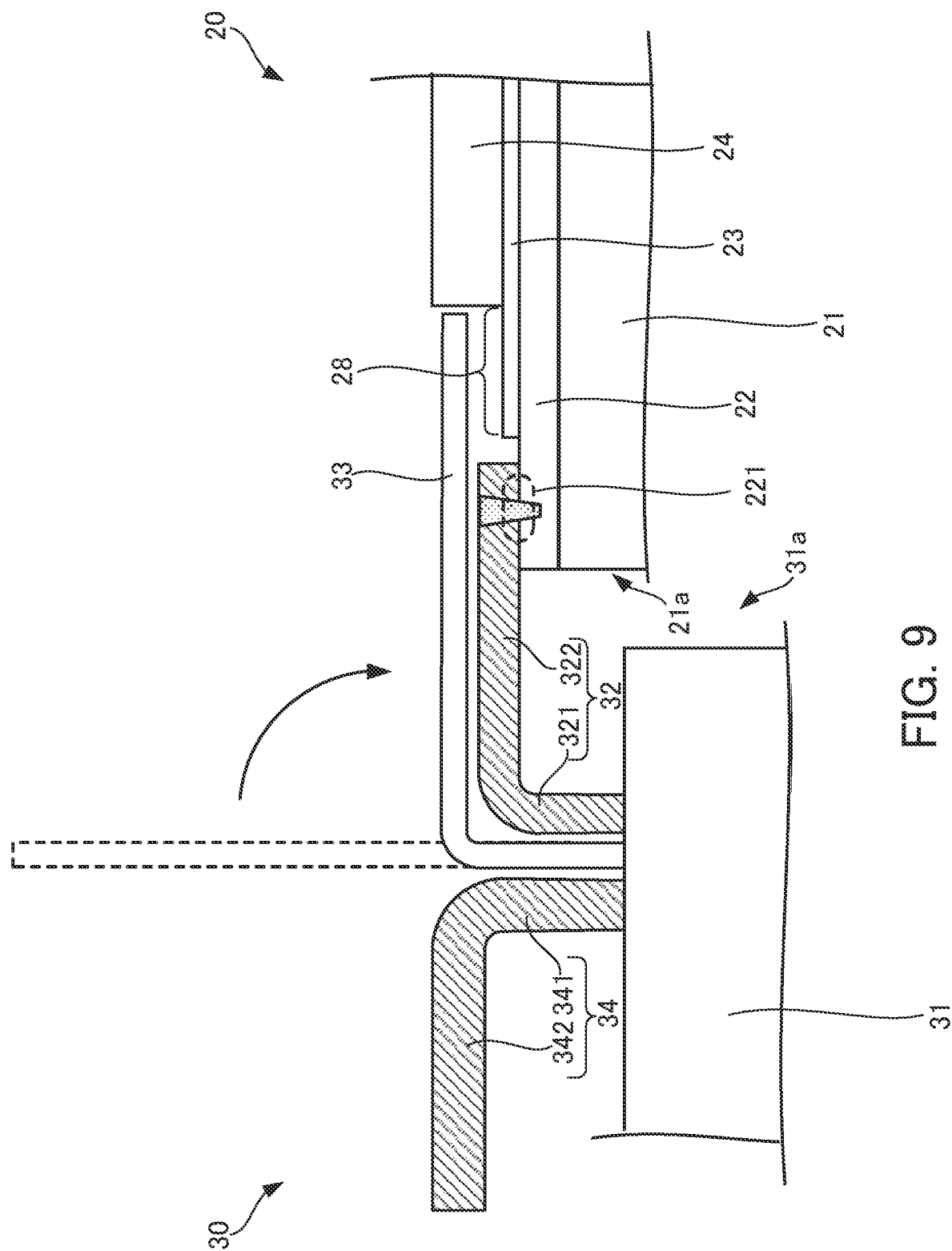
FIG. 9 is a second sectional view illustrating the connection method of the semiconductor device according to the embodiment.
Figure 10:
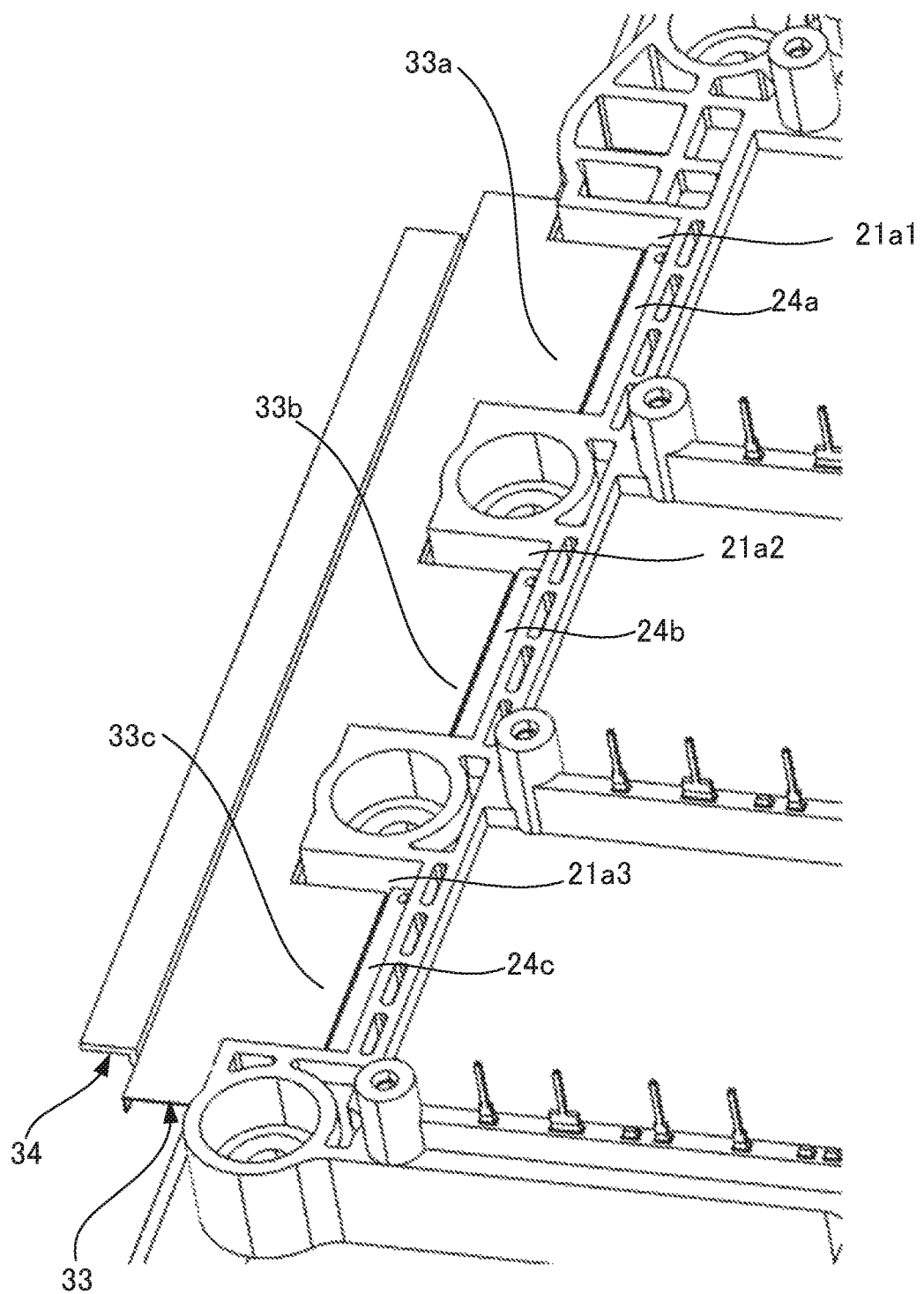
FIG. 10 is a second perspective view illustrating the connection method of the semiconductor device according to the embodiment.

Next, a connection method of the semiconductor module 20 and the capacitor 30 of the semiconductor device 10 will be described with reference to FIGS. 7 to 10 and FIGS. 5 and 6. FIGS. 7 and 9 are each a sectional view illustrating a connection method of the semiconductor device according to the embodiment. FIGS. 8 and 10 are each a perspective view illustrating the connection method of the semiconductor device according to the embodiment. FIGS. 7 and 9 correspond to the sectional view in FIG. 5. FIGS. 8 and 10 are each an enlarged perspective view of the connection between the semiconductor module 20 and the capacitor 30.

First, a tip portion of the first wiring portion 322 of the individual second connection terminal 32 of the capacitor 30 is positioned with respect to the individual second power terminal 22 of the semiconductor module 20. The front surface of the second wiring portion 342 of the first connection terminal 34 of the capacitor 30 and the front surface of the individual first power terminal 24 (the first power terminals 24a, 24b, and 24c) of the semiconductor module 20 are on the same plane. In this state, laser welding is performed to bond the tip portion of the first wiring portion 322 to the individual second bonding region 221 of the second power terminal 22 (FIG. 7). This laser bonding will be described when the description of the welding of the individual first bonding region 241 is made. In addition, as described above, the first wiring portion 322 has a comb-teeth shape including the first connection portion 32a, the second connection portion 32b, and the third connection portion 32c in a planar view. Thus, the first connection portion 32a, the second connection portion 32b, and the third connection portion 32c of the first wiring portion 322 are bonded to the second bonding regions of the second power terminals 22a, 22b, and 22c in the terminal areas 21a1, 21a2, and 21a3, respectively (FIG. 8). Since located behind the first connection portion 32a, the second connection portion 32b, and the third connection portion 32c, the second power terminals 22a, 22b, and 22c are not illustrated in FIG. 8. In addition, in FIG. 8, laser welding marks 44c are formed on the first connection portion 32a, the second connection portion 32b, and the third connection portion 32c of the second connection terminal 32. These laser welding marks 44c are also formed by seam laser or spot laser. FIG. 8 illustrates a case in which the bonding is made by spot laser.

Next, the second insulating sheet 33 of the capacitor 30 is bent towards the semiconductor module 20. Being flexible, the second insulating sheet 33 is bendable at once. After bent, the tip portion of the second insulating sheet 33 is located above the terrace portions 28 of the first insulating sheets 23 exposed to the outside between the exposed portions of the second power terminals 22 and the first end portions of the first power terminals 24 of the semiconductor module 20 (FIG. 9). The bent second insulating sheet 33 may be into contact with the second power terminals 22, the first insulating sheets 23, or the first power terminals 24. In addition, as described above, the tip portion of the second insulating sheet 33 has a comb-teeth shape including the first attachment portion 33a, the second attachment portion 33b, and the third attachment portion 33c in a planar view. Thus, the first attachment portion 33a, the second attachment portion 33b, and the third attachment portion 33c of the second insulating sheet 33 cover the first insulating sheets 23a, 23b, and 23c, respectively (FIG. 10). Since located behind the first attachment portion 33a, the second attachment portion 33b, and the third attachment portion 33c of the second insulating sheet 33, the first insulating sheets 23a, 23b, and 23c are not illustrated in FIG. 10.

Next, the first end portion of the individual connecting member 40 is set on the front surface of the second wiring portion 342 of the first connection terminal 34 of the capacitor 30, and the second end portion of the individual connecting member 40 is set on the front surface of the corresponding first power terminal 24 of the semiconductor module 20. Next, laser welding is performed to bond the first end portion of the individual connecting member 40 to the front surface of the second wiring portion 342 of the capacitor 30 and to bond the second end portion of the individual connecting member 40 to the front surface of the corresponding first power terminal 24 of the semiconductor module 20 (FIG. 5). Since the thickness of the individual connecting member 40 is less than the thickness of the individual first power terminal 24, the laser welding is performed more effectively. The connecting members 40a, 40b, and 40c bond the first power terminals 24a, 24b, and 24c of the semiconductor module 20 and the second wiring portion 342 of the first connection terminal 34 of the capacitor 30 (FIG. 1). In this way, the semiconductor device 10 in which the semiconductor module 20 and the capacitor 30 are coupled to each other is obtained.

Next, the laser welding for bonding the connecting member 40 and the first power terminal 24 illustrated in FIG. 6 will be described. The following description assumes that spot laser is performed. In addition, widely used laser is used for the welding. Examples of the laser include carbon dioxide laser, yttrium aluminum garnet (YAG) laser, fiber laser, and disk laser.

First, the insulation property and the distance D between the bottommost portion 51 of the welded portion 50 and the front surface 231 of the first insulating sheet 23 depending on the laser output will be described with reference to FIG. 11. FIG. 11 is a table illustrating the insulation property with respect to the laser output used in the connection method of the semiconductor device according to the embodiment. FIG. 11 is a table of values relating to a single-spot welded portion 50. In FIG. 11, "laser output" represents values obtained by normalizing actual laser output values, and "insulation property" represents whether the first insulating sheet 23 is damaged and the insulation property thereof is maintained. For example, the first insulating sheet 23 is damaged when the welded portion 50 penetrates the first power terminal 24 and an opening is made in the first insulating sheet 23. If an opening is made in the first insulating sheet 23, the insulation property between the first power terminal 24 and the second power terminal 22 is not maintained. In light of this, if the insulation property is maintained, "good" is indicated. If the insulation property is not maintained, "poor" is indicated. In addition, "distance D [mm]" represents the distance D between the bottommost portion 51 of the welded portion 50 and the front surface 231 of the first insulating sheet 23 illustrated in FIG. 6. In addition, the table illustrated in FIG. 11 is created by performing spot laser at several locations with the same laser output and using the minimum distance D among the obtained distances D.

As indicated in FIG. 11, it is seen that the larger the laser output is, the shorter the distance D will be. This is because the penetration depth of the welded portion 50 deepens as the laser output increases. The insulation property is maintained when the laser output is in the range from 1.00 to 1.04. That is, unless the laser output is more than 1.04, the first insulating sheet 23 is not damaged. When the laser output is 1.04, the distance D is 0.31 mm.

However, when the laser output exceeds 1.04 and reaches 1.06, the insulation property is not maintained. That is, as seen from the distance D representing 0, it is thought that the welded portion 50 has reached the first insulating sheet 23 and an opening has been made in the first insulating sheet 23. Thus, since the insulation property is not maintained between the first power terminal 24 and the second power terminal 22, "poor" is indicated as the insulation property. Thus, when the laser output is 1.06 or more, the insulation property becomes "poor" and the distance D becomes 0.

Thus, when the first power terminal 24 and the connecting member 40 are sequentially stacked on the front surface 231 of the first insulating sheet 23 and laser welding is performed on the front surface 401 of the connecting member 40, the maximum value of the laser output needed to maintain the insulation property is 1.04. In addition, to maintain the insulation property, the distance D between the bottommost portion 51 of the welded portion 50 and the front surface 231 of the first insulating sheet 23 needs to be 0.3 mm or more. More preferably, the distance D needs to be 0.31 mm or more. That is, if the distance D is less than 0.31 mm, the insulation property is not maintained. The distance D is set in the same way in a case where the thickness T2 is, for example, 1.2 mm.

Next, the welding property, the strength property, and the welded area S of the welded portion 50 depending on the laser output will be described with reference to FIG. 12. FIG. 12 is a table indicating the welding property with respect to the laser output used in the connection method of the semiconductor device according to the embodiment. FIG. 12 is also a table of values relating to a single-spot welded portion 50. In FIG. 12, "laser output" corresponds to that in FIG. 11, and "welding property" represents the welding state between the connecting member 40 and the first power terminal 24. That is, when the bottommost portion 51 of the welded portion 50 is present in the first power terminal 24, "good" is indicated. If not, "poor" is indicated. The welding property corresponding to when the laser output is 1.06 or more depends on whether the first insulating sheet 23 is damaged, even if the connecting member 40 and the first power terminal 24 have been bonded to each other. That is, the welding property corresponding to when the laser output is 1.06 or more is determined based on the "insulation property" corresponding to when the laser output is 1.06 or more in FIG. 11. In addition, "strength (average) [N]" represents the average of bonding strengths between the connecting member 40 and the first power terminal 24 by the welded portion 50 in FIG. 6. The table illustrated in FIG. 12 is also created by performing spot laser at several locations with the same laser output. The average of strengths is the average of strengths at these several locations. In addition, "strength property" represents whether the connecting member 40 and the first power terminal 24 have been peeled off, that is, whether the bonding between the connecting member 40 and the first power terminal 24 is maintained. Even if one attempts to peel off the connecting member 40 and the first power terminal 24 that have been welded to each other, the bonding therebetween needs to be maintained. If the bonding is maintained, "good" is indicated. If not, "poor" is indicated. In addition, "welded area S [mm$^2$]" represents the welded area S on the rear surface 402 of the connecting member 40 of the welded portion 50 illustrated in FIG. 6.

In light of FIG. 12, first, the welding property will be described. When the laser output is 0.96, the welding property indicates "poor". When the laser output is between 0.98 and 1.04, inclusive, the welding property indicates "good". When the laser output is 1.06 or more, the welding property indicates "poor".

It is thought that, when the laser output is 0.96, the laser output is not sufficient for the bottommost portion 51 of a welded portion 50 to reach the corresponding first power terminal 24. Thus, the corresponding connecting member 40 and first power terminal 24 are not sufficiently welded to each other, and the strength property indicates "poor". Even when the same laser output is used, the penetration depth of the welding varies. Thus, the welded portion 50 could reach the first power terminal 24 in some cases.

When the laser output is between 0.98 and 1.04, inclusive, it is thought that the bottommost portion 51 of the welded portion 50 reaches the first power terminal 24. Thus, the connecting member 40 and the first power terminal 24 are sufficiently welded to each other, and the strength property indicates "good". In addition, when the laser output is 1.06 or more, as described with reference to FIG. 11, it is thought that the bottommost portion 51 of the welded portion 50 penetrates the first power terminal 24 and reaches the first insulating sheet 23. Thus, while the connecting member 40 and the first power terminal 24 are welded to each other, since the first insulating sheet 23 is damaged, the welding property indicates "poor".

Next, the strength will be described. It is seen that, basically, the larger the laser output is, the larger the strength will be. Even when the welding property has indicated "poor", the strength ([N]) has been measured. As described above, even when the same laser output is used, the penetration depth of the welding differs. Thus, when the laser output is 0.96, as described above, while the welding property indicates "poor", the welded portion 50 could reach the first power terminal 24 in some cases. Thus, it is thought that there is weak strength between the connecting member 40 and the first power terminal 24. In addition, when the strength is 20 [N] or more, the strength property indicates "good" and the welding between the connecting member 40 and the first power terminal 24 achieves sufficient strength. In addition, basically, the larger the laser output is, the larger the welded area S will be. That is, it is thought that the increase in the welded area S along with the increase in the penetration depth of the welded portion 50 as the laser output rises attributes to the increase in the strength between the connecting member 40 and the first power terminal 24.

Thus, when the first power terminal 24 and the connecting member 40 are sequentially stacked on the front surface 231 of the first insulating sheet 23 and laser welding is performed on the front surface 401 of the connecting member 40, the welded area S needs to be 0.22 mm$^2$ or more, to obtain secure strength between the first power terminal 24 and the connecting member 40. In addition, in view of the welding property (and the insulation property), the welded area S is preferably 0.48 mm$^2$ or less.

As described above, the laser welding on the first bonding region 241 between the connecting member 40 and the first power terminal 24 is performed in such a manner that the above distance D and welded area S are achieved. In addition, the widths of the first power terminals 24a, 24b, and 24c exposed to the outside in a comb-teeth shape from the case 21 and the connecting members 40a, 40b, and 40b correspond to the widths of the respective storage areas 21c1, 21c2, and 21c3 in the longitudinal direction of the case 21. The width of the welded portion of the individual welded member on which welding is performed (the individual connecting member 40) is, for example, between 16.5 mm and 20.4 mm, inclusive. With this semiconductor device 10, in this width, a line of dotted welded portions 50 (a linear welded portion 50 if seam laser is used) is formed by spot laser. For example, if the width of the welded portion of the welded member is 16.5 mm and if the laser output is 1.00, the spot diameter of the individual laser spot is 1.2 mm, and 13 spots are welded. Thus, a total area of these laser spots (a total laser emission area on the top surface of the connecting member 40) is 14.7 mm$^2$ (radius 0.6 mm×radius 0.6 mm×π×13). The welded area is suitably adjusted by adjusting the spot diameter of the laser, the thickness of the welded member corresponding to the upper surface portion, and the aperture angle of the laser. In addition, the strength (average) in this case is 494 N (38 N×13). If this welding by the laser spot is performed in two or three lines, the number of laser spots, the total area of all the spots, and the strength (average) will be twice or three times those of when this welding is performed in a single line.

In addition, the same laser welding may be performed on the individual second connection terminal 32 and the individual second power terminal 22. That is, the second power terminals 22 are disposed on the front surface (the second front surface) of the case 21, and the rear surfaces (the first rear surfaces) of the second connection terminals 32 are disposed on the second power terminals 22. In the second bonding region 221 on the front surface (first front surface) of an individual second connection terminal 32, a welded portion penetrates the second connection terminal 32 from the front surface thereof vertically downward (in the direction of the case 21). That is, the welded portion penetrates the second connection terminal 32 from the front surface thereof to the rear surface thereof and into the corresponding second power terminal 22. As a result, the second connection terminal 32 and the second power terminal 22 are bonded to each other by the welded portion. In this state, the distance between the bottommost portion, which corresponds to the penetration depth of the welded portion, and the front surface of the case 21 is distance D. This distance D is also 0.3 mm or more. In this case, too, it is preferable that the welded area S of the welded portion, the welded area S being on the rear surface of the second connection terminal 32, be 0.22 mm$^2$ or more. Consequently, it is possible to weld the second connection terminal 32 and the second power terminal 22 with secure strength while preventing the case 21, on which the second power terminal 22 is disposed and which is made of resin, from being damaged.

The semiconductor device 10 includes the semiconductor module 20 and the capacitor 30. The capacitor 30 includes the case 31 including capacitor elements, the second connection terminal 32, the first connection terminal 34, and the second insulating sheet 33 disposed between the second connection terminal 32 and the first connection terminal 34. The second connection terminal 32, the second insulating sheet 33, and the first connection terminal 34 extend to the outside from the case 31. The semiconductor module 20 includes the stacked terminal portions 25, each of which is formed by sequentially stacking a second power terminal 22, a first insulating sheet 23, and a first power terminal 24. The individual second power terminal 22 includes a second bonding region 221 electrically connected to the second connection terminal 32, and the individual first power terminal 24 includes a first bonding region 241 electrically connected to the first connection terminal 34. The individual first insulating sheet 23 has a terrace portion 28 that extends in a direction from the corresponding first bonding region 241 towards the corresponding second bonding region 221 in a planar view.

In addition, the semiconductor device 10 includes the capacitor 30 and the semiconductor module 20. The capacitor 30 includes the case 31 including capacitor terminals, the first connection terminal 34 that is electrically connected to a connecting member 40 having a front surface 401 and a rear surface 402 opposite to the front surface 401 and that extends from the case 31. The semiconductor module 20 includes the first power terminals 24 and the first insulating sheets 23, each of which has the front surface 231. The individual first power terminal 24 is disposed on the corresponding front surface 231. The rear surface 402 of a connecting member 40 is disposed on the corresponding first power terminal 24, and the connecting member 40 is bonded to the first power terminal 24 by the welded portion 50 penetrating the front surface 401 and the rear surface 402. In addition, the distance D between the bottommost portion 51, which corresponds to the penetration depth of the welded portion 50 from the front surface 401, and the front surface 231 is 0.3 mm or more. Thus, since the first insulating sheet 23 is not damaged, the insulation property of the first insulating sheet 23 is maintained. Thus, it is possible to bond the connecting member 40 and the first power terminal 24 without damaging the first power terminal 24 and therearound and maintain the reliability of the semiconductor device 10.

The semiconductor module 20 and the capacitor 30 of the semiconductor device 10 are connected as close to each other as possible by the connecting members 40 and the second connection terminal 32. Thus, the length of an individual wiring between the semiconductor module 20 and the capacitor 30 is also as short as possible. The inductance of the semiconductor device 10 is consequently reduced. In addition, with this connection, the second connection terminal 32 and the connecting members 40 are disposed in parallel with each other. In this way, since the direction of the current flowing through the second connection terminal 32 is opposite to that of the current flowing through the individual connecting member 40, the magnetic field formed by these currents are offset. Thus, the inductance of the semiconductor device 10 is further reduced. Thus, compared with a case in which the semiconductor module 20 and the capacitor 30 of the semiconductor device 10 are connected to each other simply by screwing, the inductance is reduced more significantly.

According to the embodiment discussed above, it is possible to bond terminals without damaging the terminals and therearound and maintain the reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a capacitor;
a semiconductor module, including a first power terminal formed on a front surface of a first insulating member; and
a connecting member electrically connecting and mechanically coupling the semiconductor module and the capacitor to each other, the connecting member having a front surface and a rear surface opposite to each other, the rear surface being on a front surface of the first power terminal, wherein
the connecting member is bonded to the semiconductor module via a first welded portion, which penetrates the front and rear surfaces of the connecting member, and penetrates the front surface of the first power terminal, in a thickness direction of the semiconductor device, a distance in the thickness direction between a bottommost portion of first welded portion and the front surface of the first insulating member being 0.3 mm or more.

2. The semiconductor device according to claim 1, wherein a bonding strength on the rear surface of the connecting member, achieved by the first welded portion between the connecting member and the first power terminal, is 20 N or more.

3. The semiconductor device according to claim 2, wherein a welded area of the first welded portion on the rear surface of the connecting member is 0.22 mm$^2$ or more.

4. The semiconductor device according to claim 1, wherein the first welded portion is provided in plurality arranged linearly in a plan view of the semiconductor device.

5. The semiconductor device according to claim 1, wherein the capacitor includes
a case, and
a first connection terminal, a second connection terminal, and a flexible insulating member extending outside from the case, the flexible insulating member being disposed between the first connection terminal and the second connection terminal,
wherein the semiconductor module further includes a second power terminal, on which the first power terminal and the first insulating member are stacked, to thereby form a stacked terminal portion, the second power terminal having a front surface and a rear surface opposite to each other,
wherein the second connection terminal has a front surface and a rear surface opposite to each other, the rear surface thereof being disposed on the second power terminal,
wherein the second connection terminal is bonded to the second power terminal by a second welded portion that penetrates the front surface and the rear surface of the second connection terminal, and penetrates the front surface of the second power terminal, in the thickness direction,
wherein a distance in the thickness direction between a bottommost portion of the second welded portion and the rear surface of the second power terminal is 0.3 mm or more, and
wherein the first insulating member includes a terrace portion extending in a direction from the first welded portion toward the second welded portion.

6. The semiconductor device according to claim 5, wherein
the stacked terminal portion is provided on a first side portion of the semiconductor module, and
the first connection terminal, the flexible insulating member, and the second connection terminal of the capacitor are disposed next to the first side portion of the semiconductor module.

7. The semiconductor device according to claim 6, wherein at least a part of a current path from the second connection terminal to the second power terminal is parallel to the second connection terminal via the flexible insulating member.

8. The semiconductor device according to claim 6, wherein an end of the second connection terminal is bonded by the second welded portion to the second power terminal.

9. The semiconductor device according to claim 5, wherein the connecting member is electrically connected to the first connection terminal by a third welded portion.

10. The semiconductor device according to claim 1, wherein the connecting member has a thickness less than a thickness of the first power terminal.

11. The semiconductor device according to claim 6, wherein the stacked terminal portion is provided in plurality arranged along the first side portion.

12. The semiconductor device according to claim 5, wherein on the semiconductor module,
an end of the second power terminal and the second welded portion are located outside the terrace portion of the first insulating member, and
the terrace portion of the first insulating member is located outside an end of the first power terminal.

* * * * *